United States Patent
Pasqualini

(10) Patent No.: US 6,690,555 B1
(45) Date of Patent: Feb. 10, 2004

(54) ELECTROSTATIC DISCHARGE PROTECTION CIRCUIT WITH CASCODED TRIGGER-SWITCH SUITABLE FOR USE WITH OVER-VOLTAGE TOLERANT CMOS INPUT/OUTPUT BUFFERS

(75) Inventor: Ronald Pasqualini, Los Altos, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 126 days.

(21) Appl. No.: 09/816,748

(22) Filed: Mar. 25, 2001

(51) Int. Cl.$^7$ ................................................ H02H 9/00
(52) U.S. Cl. ........................................ 361/56; 361/91.1
(58) Field of Search ..................... 361/56, 91.1, 91.2, 361/91.8, 91.5, 111, 118, 119

(56) References Cited

U.S. PATENT DOCUMENTS

| | | | | |
|---|---|---|---|---|
| 4,651,037 A | * | 3/1987 | Ogasawara et al. | 307/572 |
| 5,255,146 A | * | 10/1993 | Miller | 361/56 |
| 5,598,313 A | * | 1/1997 | Gershbach | 361/56 |
| 5,930,094 A | * | 7/1999 | Amerasekera et al. | 361/56 |
| 6,011,681 A | * | 1/2000 | Ker et al. | 361/111 |
| 6,249,410 B1 | * | 6/2001 | Ker et al. | 361/56 |
| 6,310,379 B1 | * | 10/2001 | Andersen et al. | 257/355 |
| 6,388,850 B1 | * | 5/2002 | Ker et al. | 361/56 |
| 6,459,553 B1 | * | 10/2002 | Drapkin et al. | 361/56 |

\* cited by examiner

*Primary Examiner*—Brian Sircus
*Assistant Examiner*—Zeev Kitov

(57) ABSTRACT

A novel trigger switch for an electrostatic discharge protection circuit is disclosed The trigger switch includes a first transistor with one source/drain terminal coupled to a positive electrostatic discharge node of the electrostatic discharge protection circuit. A second transistor has one source/drain terminal coupled to a negative electrostatic discharge node of the electrostatic discharge protection circuit. The second transistor has a second source/drain terminal coupled to a second source/drain terminal of the first transistor. A first resistance is coupled between the positive electrostatic discharge node and a gate terminal of the first transistor. A first capacitance is coupled between the negative electrostatic discharge node and the gate terminal of the first transistor. A second resistance is coupled between the negative electrostatic discharge node and a gate terminal of the second transistor. A second capacitance is coupled between the positive electrostatic discharge node and the gate terminal of the second transistor. The trigger switch provides a low-resistance connection between the positive and negative electrostatic discharge nodes of the electrostatic discharge protection circuit in response to an electrostatic discharge event. The trigger switch responds to a power-off ESD event by dissipating the current of the ESD pulse, but does not respond to over-voltage conditions or sudden transitions of the ESD node voltages under power-on conditions.

20 Claims, 2 Drawing Sheets

ELECTROSTATIC DISCHARGE PROTECTION CIRCUIT WITH CASCODED TRIGGER-SWITCH SUITABLE FOR USE WITH OVER-VOLTAGE TOLERANT CMOS INPUT/OUTPUT BUFFERS

TECHNICAL FIELD OF THE INVENTION

The present invention relates to electrostatic discharge protection circuits, and in particular to an electrostatic discharge protection circuit with a cascoded trigger-switch suitable for use with over-voltage tolerant CMOS I/O buffers.

BACKGROUND OF THE INVENTION

Electrostatic discharge (ESD) protection circuits, which are used to protect the I/O pads of integrated circuit (IC) chips, are well known. Such circuits typically provide a means to shunt electrostatic discharge current to ground (or another common terminal), in order to prevent damage to transistors and other sensitive components on an integrated circuit chip.

It is highly advantageous for IC chips, operating from different power supplies, to operate together within the same system. For example, it is advantageous for a CMOS chip, operating from a 3.3 volt power supply, to interface with another CMOS chip, operating from a 5 volt power supply. This requires that the I/O pads on the 3.3 volt CMOS chip tolerate "over-voltage" input levels as high as 5.5 volts. For the 3.3 volt CMOS chip, these over-voltage levels can be present on its input pins and/or bi-directional I/O pins (tristate™ pins).

The over-voltage levels described above can cause a serious over-voltage problem for the transistors present in a conventional CMOS ESD trigger-switch circuit. This over-voltage problem causes the trigger-switch transistors to be subjected to voltages beyond their tolerances, resulting in transistor failure. Thus, in a conventional ESD trigger-switch, over-voltages can occur on p-channel transistor terminal pairs and/or n-channel transistor terminal pairs. These terminal pairs include gate-to-source, gate-to-drain, gate-to-body, drain-to-source, source-to-body and drain-to-body.

Another problem with a conventional ESD trigger-switch is false triggering, which can occur during normal power-on operation. This false triggering creates an unwanted low resistance current path between the 3.3 volt power supply (driving a 3.3 volt CMOS chip), and the 5 volt power supply (driving a 5 volt CMOS chip). This unwanted current path is a very serious problem because it degrades system noise immunity, interferes with normal I/O cell logic operation, and causes excessive power dissipation. Furthermore, this excessive power dissipation can easily induce failure in the 5 volt output drivers, the ESD protection diodes and the metal wires which are present inside the ESD protection circuit. Thus, accidental ESD trigger-switch turn-on during normal power-on IC operation is a very serious problem which must be overcome.

SUMMARY OF THE INVENTION

Thus, a need has arisen for an electrostatic discharge protection circuit with a trigger-switch that addresses the disadvantages and deficiencies of the prior art. In particular, a need has arisen for an electrostatic discharge protection circuit which (a) can be used in over-voltage applications and non-over-voltage applications; (b) keeps the power-on terminal voltages for all ESD trigger-switch transistors below their maximum values; and (c) is highly resistant to accidental turn-on during normal power-on operating conditions (due to glitches on the ESD+ power rail)

Accordingly, a novel trigger switch for an electrostatic discharge protection circuit is disclosed. In one embodiment, the trigger switch includes a first transistor with one source/drain terminal coupled to a positive electrostatic discharge node of the electrostatic discharge protection circuit. A second transistor has one source/drain terminal coupled to a negative electrostatic discharge node of the electrostatic discharge protection circuit. The second transistor has a second source/drain terminal coupled to a second source/drain terminal of the first transistor. A first resistance is coupled between the positive electrostatic discharge node and a gate terminal of the first transistor. A first capacitance is coupled between the negative electrostatic discharge node and the gate terminal of the first transistor. A second resistance is coupled between the negative electrostatic discharge node and a gate terminal of the second transistor. A second capacitance is coupled between the positive electrostatic discharge node and the gate terminal of the second transistor. The trigger switch provides a low-resistance connection between the positive and negative electrostatic discharge nodes of the electrostatic discharge protection circuit in response to an electrostatic discharge event Advantages of the present invention include the ability to tolerate over-voltage conditions during normal power-on operation, and the ability to avoid false triggering (due to sudden transitions on the ESD power rail) during power-on operating conditions. Of course, the present invention will also protect the I/O pins of an IC during an ESD event.

BRIEF DESCRIPTION OF THE DRAWINGS

For a more complete understanding of the present invention and for further features and advantages, reference is now made to the following description taken in conjunction with the accompanying drawings, in which.

DETAILED DESCRIPTION OF THE INVENTION

Figure 1:
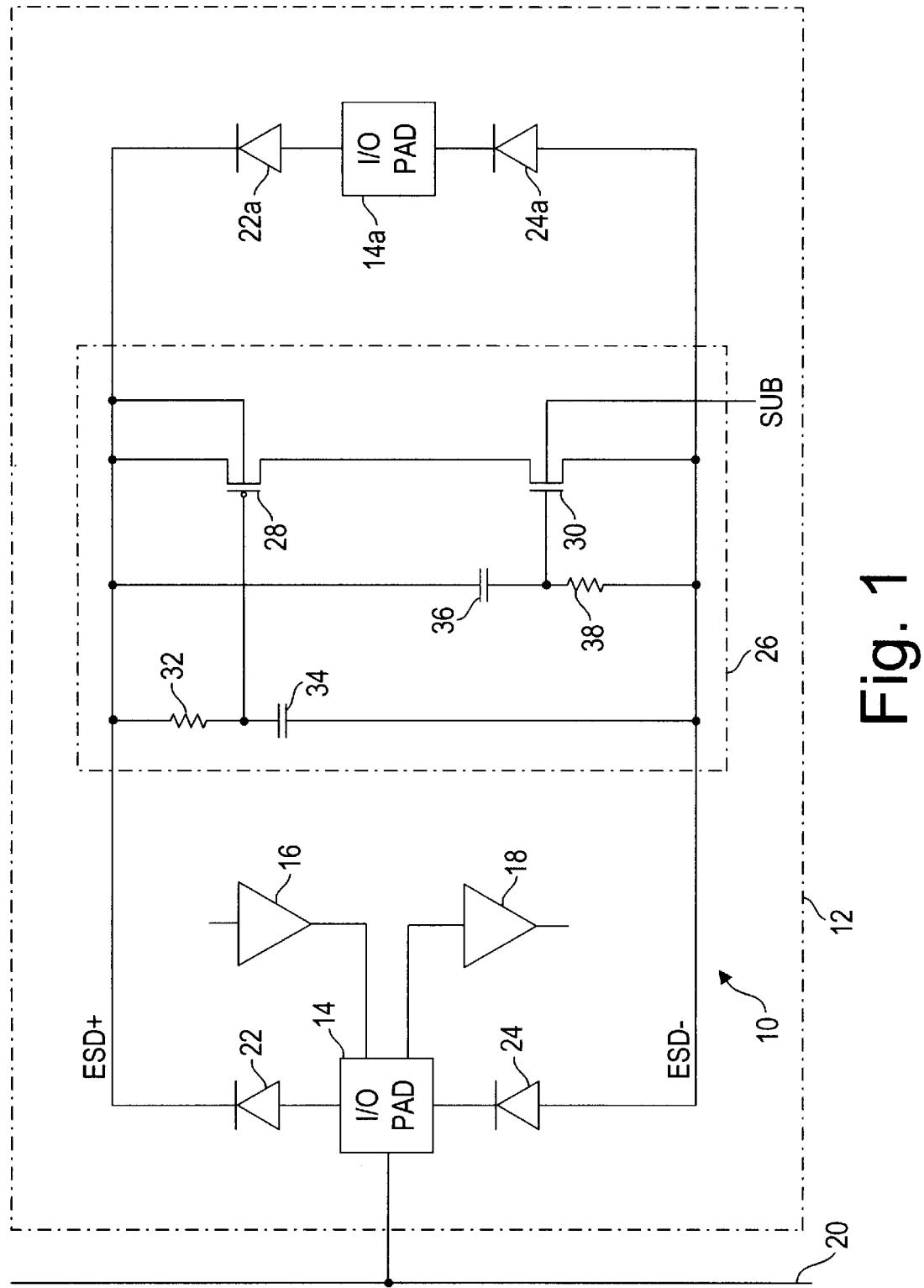
FIG. 1 is a simplified schematic diagram of an input/output pad circuit including a simplified electrostatic discharge protection circuit.
Figure 2:
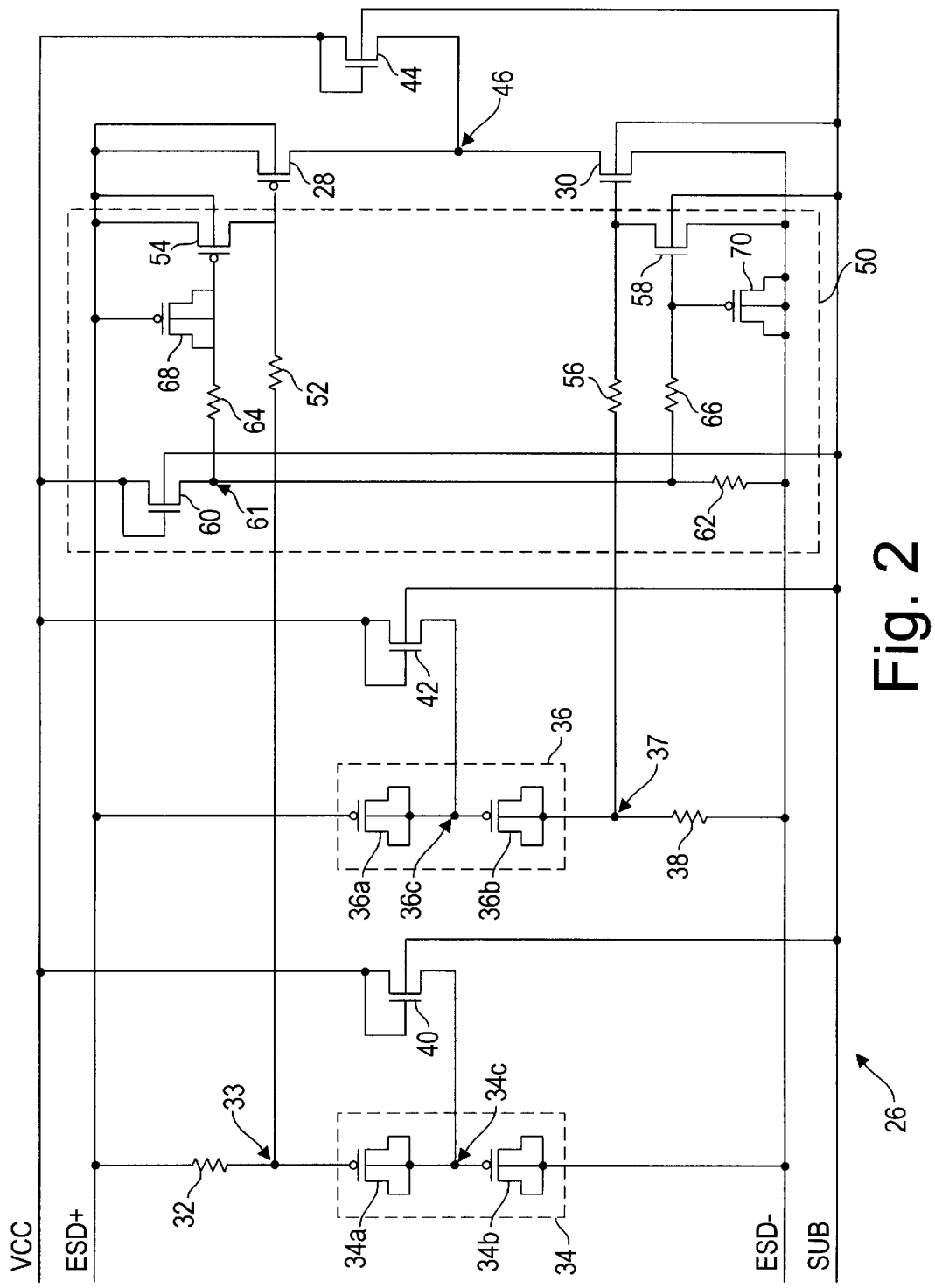
FIG. 2 is a detailed schematic diagram of a complete electrostatic discharge trigger switch for the electrostatic discharge protection circuit.

The preferred embodiments of the present invention can be best understood by referring to FIGS. 1 and 2. Like numerals are used for like and corresponding parts of the figures.

FIG. 1 shows a schematic diagram for a simplified ESD protection circuit 10 on a simplified CMOS IC chip 12. Chip 12 may be, for example, a CMOS IC chip operating from a supply voltage of 3.3 volts, 5 volts or any other standard CMOS power supply voltage. Referring to ESD protection circuit 10, an input/output (I/O) pad 14 receives an output signal from output buffer 16. Output buffer 16 may be, for example, a tristate™ output buffer operating at a supply voltage of 3.3 volts, 5 volts or any other standard CMOS power supply voltage. Output buffer 16 receives data and control signals from other circuitry (not shown) on chip 12. I/O pad 14 is also connected to input buffer 18, which buffers an input signal from I/O pad 14 and provides the signal to other circuitry (not shown) on chip 12.

I/O pad 14 is also connected to an external signal bus 20 by means of conventional chip-to-package and package-to-circuit board connections. Bus 20 may carry input and output signals for chip 12 and input and output signals for other bus devices (not shown) such as microprocessors and controllers. One or more of the other devices sharing bus 20 may provide output signals at a higher voltage level than chip 12. For example, if chip 12 is operating from 3.3 volts, other devices sharing bus 20 may be operating at 5.0 volts.

ESD protection is provided for I/O pad 14 by diodes 22 and 24, and by an ESD trigger-switch 26. Diode 22 provides a discharge path for positive ESD current pulses from I/O pad 14 to the ESD+ rail, while diode 24 provides a discharge path for negative ESD current pulses from I/O pad 14 to the ESD− rail. Diodes 22 and 24 may be conventional ESD protection diodes.

Referring to FIG. 1, ESD protection is provided for I/O pad 14a by diodes 22a and 24a respectively, in the same manner that diodes 22 and 24 provide ESD protection for I/O pad 14. I/O pad 14a may also be connected to bus 20 (or to a similar external bus), and to external input/output buffers (not shown), in the same manner as I/O pad 14. Other I/O pads (not shown) on chip 12 may also be connected to the ESD+ and ESD− rails through additional diodes.

An ESD event occurs when a high ESD voltage is applied across two (or more) I/O pads on chip 12. Since all of the I/O pads on chip 12 are connected to the ESD+ and ESD− rails via diodes similar to those shown in FIG. 1, for purposes of illustration it will be assumed that the two I/O pads involved in an ESD event (i.e. being zapped) are I/O pads 14 and 14a.

During an ESD event, trigger-switch 26 turns on, providing a low impedance current path (on the order of 1.5 ohms or less) between the ESD+ rail and the ESD− rail. This low impedance current path keeps the ESD voltage on I/O pads 14 and 14a close to ground potential, allowing all of the energy in the high voltage ESD spark to be harmlessly dissipated.

As shown in FIG. 1, ESD trigger-switch 26 includes two switching transistors (p-channel transistor 28 and n-channel transistor 30) connected in series between the ESD+ rail and the ESD− rail. This two transistor connection replaces the single transistor normally used in ESD trigger-switches which are not tolerant of over-voltage conditions. Two series-connected transistors are used in place of a single transistor in order to reduce (to acceptable voltage levels) the terminal-to-terminal voltages seen by each transistor. This cannot be accomplished with a single switching transistor.

During an ESD event transistors 28 and 30 will both turn on, providing a low impedance current path between the ESD+ rail and the ESD− rail. Transistors 28 and 30, like the other transistors inside ESD trigger switch 26, are CMOS transistors. Thus the substrate of p-channel transistor 28 is connected to the ESD+ rail, and the substrate (SUB) of n-channel transistor 30 is connected to the ESD− rail (which may or may not be grounded under power-on conditions).

Referring to FIG. 1, the gate of transistor 28 is connected to the ESD+ rail via resistor 32, and to the ESD− rail via capacitor 34. Thus, in order to ensure that the ESD protection circuit will turn on during an ESD event, the values of resistor 32 and capacitor 34 must be chosen so that their RC time constant will be long with respect to the ESD event duration (which typically lasts from 5 to 50 nanoseconds).

Furthermore, in order to prevent false turn-on of the ESD protection circuit at power-on time, the RC time constant provided by resistor 32 and capacitor 34 must be short with respect to the power supply rise time (which cannot be less than four milliseconds for a 60 Hz AC power supply).

Thus, in order to satisfy both of the aforementioned timing conditions, a nominal RC time constant on the order of 10 to 100 microseconds may be chosen. This value meets both timing conditions and still leaves room for time constant variation due to normal IC process variations.

As shown in FIG. 1, the gate of transistor 30 is connected to the ESD+ rail via capacitor 36, and to the ESD− rail via resistor 38. The RC time constant of capacitor 36 and resistor 38 should be the same as the RC time constant of resistor 32 and capacitor 34. This ensures that transistor 28 and transistor 30 will both turn on at the same time during an ESD event.

Turn on of the simplified ESD trigger-switch 26 shown in FIG. 1 during an ESD event will now be described. Under power-off conditions (i.e. when chip 12 is not attached to a circuit board and/or no power supply voltage is present), the ESD+ and ESD− rails will be at approximately the same voltage (i.e. close to ground potential or zero volts). At the beginning of an ESD event, the voltage on the ESD+ rail will begin to increase with respect to the voltage on the ESD− rail. Since this voltage increase occurs much faster than the RC time constant of resistor 32 and capacitor 34, the voltage across capacitor 34 will initially remain close to zero. Therefore, the gate voltage of transistor 28 will initially remain close to zero. Since the source terminal of transistor 28 is connected to the ESD+ rail, which is rising, the gate-to-source voltage of transistor 28 will become increasingly negative. When the gate-to-source voltage of transistor 28 exceeds its threshold voltage, transistor 28 will turn on and begin to conduct ESD current.

Similarly, during the ESD event the voltage across capacitor 36 will initially remain close to zero because of the short rise time of the ESD current pulse (in comparison to the time constant of capacitor 36 and resistor 38). Therefore, the gate voltage of transistor 30 will begin to rise, initially following the voltage increase on the ESD+ rail. Since the source terminal of transistor 30 is connected to the ESD− rail, the voltage of which is below the ESD+ rail, the gate-to-source voltage of transistor 30 will become increasingly positive. When the gate-to-source voltage of transistor 30 exceeds its threshold voltage, transistor 30 will turn on and begin to conduct ESD current. Therefore, since transistors 28 and 30 both turn on during an ESD event, they provide a low impedance path for ESD current flow, from the ESD+ rail to the ESD− rail.

Under steady state power-on conditions, no current will be flowing through resistors 32 and 38 in FIG. 1. Thus, under steady state power-on conditions, the voltage drops across both resistors will be zero. This causes the gate-to-source voltages of transistors 28 and 30 to also equal zero, ensuring that these transistors will remain off during normal steady state power-on conditions.

As described above, the simplified trigger-switch shown in FIG. 1 will turn on during an ESD event, and will remain off during steady state power-on conditions. Nonetheless, this simplified circuit shown in FIG. 1 suffers from two important limitations. The first limitation is that, during normal power-on operation, capacitors 34 and 36 can be exposed to over-voltage conditions which can cause them to fail. The source of these over-voltage conditions will now be explored.

Referring to FIG. 1, let us consider the case where chip 12 is a 3.3 volt CMOS chip and bus 20 is a 5 volt bus. Under power-on conditions, the ESD− rail may be grounded (i.e.

will be at zero volts) and I/O pad 14 will receive bus voltages from bus 20. In a typical system, the 5 volt power supply can vary by ±10%, exposing pad 14 to voltages as high as 5.5 volts.

Since the "low current" voltage drop across diode 22 is relatively low (approximately 0.25 volts), under power-on conditions the ESD+ rail will charge up to a maximum voltage of approximately 5.5−0.25=5.25 volts. Thus, when the 5 volt power supply is at its maximum value, the total voltage between the ESD+ rail and the ESD− rail will be approximately equal to 5.25 volts.

Furthermore, since the power-on voltage drops across resistors 32 and 38 are both zero, capacitors 34 and 36 will both charge up to 5.25 volts (i.e. to the maximum power-on voltage between the ESD+ and ESD− rails). This 5.25 volt voltage value causes a serious problem, however, because capacitors 34 and 36 are both formed from 3.3 volt p-channel transistors, whose terminal-to-terminal voltages cannot exceed approximately 4.1 volts.

A solution to the above problem is shown in FIG. 2, which contains a detailed schematic diagram of an ESD trigger switch 26. In this schematic diagram capacitors 34 and 36 are both composed of two identical, series-connected p-channel transistors, rather than only one. Thus capacitor 34 consists of two identical p-channel transistors 34a and 34b, and capacitor 36 consists of two identical p-channel transistors 36a and 36b.

Since capacitor 34 is composed of two identical p-channel transistors connected in series, the maximum voltage across each transistor will be approximately halved. Similarly, since capacitor 36 is also composed of two identical p-channel transistors connected in series, the maximum voltage across each transistor will also be approximately halved. Furthermore, since transistors 28 and 30 are also connected in series (i.e. cascoded), the maximum voltage across each transistor will also be approximately halved. The exact voltage values, across each of the aforementioned transistors, are discussed below.

In order to ensure that the gate-to-source voltage of each transistor forming capacitor 34 does not exceed its maximum value, node 34c (between transistors 34a and 34b) must not be allowed to float. Otherwise, the dc voltage at node 34c would depend upon the highly variable leakage currents at node 34c. Thus, as shown in FIG. 2, an additional transistor 40 has been added in order to keep node 34c at a suitable intermediate voltage. Transistor 40 is an n-channel transistor connected in a diode configuration between node 34c and the 3.3 volt power supply.

Assuming that the 3.3 volt power supply has a value of 3.3 volts ±0.3 volts, node 34c will remain between approximately 2.3 volts (minimum $V_{CC}$ of 3.0 volts minus a maximum p-channel threshold voltage of 0.7 volts) and 3.1 volts (maximum $V_{CC}$ of 3.6 volts minus a minimum p-channel threshold voltage of 0.5 volts). As a result, the maximum voltage across transistor 34a is equal to the maximum ESD+ rail voltage minus the minimum voltage at node 34c, or 5.25−2.3=2.95 volts. This voltage value is well within the normal operating range of 3.3 volt PMOS devices.

Similarly, the maximum voltage across transistor 34b is equal to the maximum voltage at node 34c, or 3.1 volts. This voltage value is also well within the normal operating range of 3.3 volt PMOS devices.

Since capacitor 34 is now being formed by identical series-connected capacitors 34a and 34b, the values of these capacitors should be doubled in comparison to the value of capacitor 34. This doubling ensures that the equivalent RC time constant will not be affected (i.e. reduced).

In order for the RC time constant of capacitor 34 and resistor 32 to be unaffected by the presence of transistor 40, the width-to-length ratio of transistor 40 must be made low enough so that the equivalent resistance of transistor 40 will be much higher than the resistance of resistor 32. This will allow the voltage at node 34c to move freely during an ESD event.

Similarly, as shown in FIG. 2, node 36c (between transistors 36a and 36b) is also kept at a well-defined voltage by transistor 42, which is connected in a diode configuration between node 36c and the 3.3 volt power supply voltage. Thus, in order for the RC time constant of capacitor 36 and resistor 38 to be unaffected by the presence of transistor 42, the width-to-length ratio of transistor 42 must be made low enough so that the equivalent resistance of transistor 42 will be much higher than the resistance of resistor 38. This will allow the voltage at node 36c to move freely during an ESD event. In most applications, transistor 42 may have the same width and length as transistor 40.

Referring to FIG. 2, transistor 44 is used to keep the voltage at a node 46 (between transistors 28 and 30) within well defined limits. Thus, in a manner similar to that of transistors 40 and 42, under power-on conditions transistor 44 sets the dc voltage at node 46 equal to one n-channel threshold below the 3.3 volt power supply. This ensures that the voltage at node 46 will not depend upon the relative magnitudes of the drain leakage currents of transistors 28 and 30.

The width-to-length ratio of transistor 44 may be made higher than that of transistors 40 and 42, in order to compensate for the higher leakage currents present at node 46 (due to the relatively large transistors 28 and 30). Thus, during normal power-on operation, transistor 44 effectively keeps the dc voltage at node 46 equal to one n-channel threshold below the 3.3 volt power supply voltage. This ensures that transistors 28 and 30 will not be subjected to excessive drain-to-source voltages during normal power-on operation.

As previously described, as long as the ESD+ rail is kept at a constant over-voltage value during normal power-on-conditions, transistors 28 and 30 will both remain off, and no current will be drawn from the ESD+ rail. This is an important point, because if even a small amount of current were to be drawn, it would have to be supplied by the external drivers at I/O pad 14, substantially increasing their signal switching time.

The simplified ESD trigger-switch shown in FIG. 1 suffers from a second limitation, however. Thus, if the voltage on the ESD+ rail changes suddenly during normal power-on operation, the trigger-switch will turn on. This unwanted false triggering is a very serious problem. The conditions under which it can occur will now be described.

Referring to FIG. 1, let us assume that chip 12 is a 3.3 volt chip operating from a 3.3 volt power supply. Furthermore, let us also assume that external bus 20 is connected to an external five volt chip whose over-voltage output driver (or drivers) can swing from zero volts to five volts. Thus, under nominal power supply conditions, bus 20 and I/O pad 14 can receive over-voltage pulses of five volts. As previously described, if these over-voltage pulses occur reasonably often, the ESD+ rail will charge up (through diodes 22 and 22a) to a nominal voltage which is approximately equal to 5−0.25=4.75 volts. When over-voltage switching activity (five volt switching activity) ceases, however, I/O pad 14 will only receive voltage pulses ranging from zero volts to 3.3 volts. These pulses could be supplied from the 3.3 volt buffer 16 in FIG. 1, or from an external 3.3 volt buffer connected to bus 20. Under these conditions, the ESD+ rail will slowly discharge until it reaches a voltage level which is approximately equal to 3.3−0.25=3.05 volts (i.e. the 3.3 volt power supply voltage minus a "low current" voltage drop across diode 22 or diode 22*a*).

When over-voltage switching activity resumes, however, the ESD+ rail will quickly charge up from a nominal voltage of 3.05 volts to a nominal voltage of 4.75 volts, a nominal voltage rise of 1.7 volts. Furthermore, in the worst case, when the 3.3 volt power supply is at its minimum value (3.0 volts), and the five volt power supply is at its maximum value (5.5 volts), the ESD+ rail can quickly charge up from a minimum voltage of approximately 2.75 volts to a maximum voltage of approximately 5.25 volts, a maximum voltage rise of 2.5 volts. The foregoing voltage rises can occur over a time interval of only a few nanoseconds. Thus, due to these rapid voltage rises, the ESD trigger-switch will turn on, just as if a real ESD event had occurred. For all intents and purposes, these rapid voltage rises are literally indistinguishable from a real ESD event.

Referring to FIG. 1, the false triggering described above will cause transistors 28 and 30 to turn on, effectively clamping the ESD+ rail voltage close to ground, and thereby clamping the voltage at I/O pad 14 at one diode drop above ground. This behavior prevents the on-chip input buffers (such as input buffer 18 in FIG. 1) from being able to distinguish a logic "1" voltage from a logic "0" voltage, causing chip malfunction.

The false triggering problem described above can be prevented by adding a power-on deactivation circuit to the simplified trigger-switch shown in FIG. 1. This deactivation circuit prevents ESD trigger switch 26 from being falsely triggered under power-on conditions.

Referring to FIG. 2, power-on deactivation circuit 50 prevents ESD trigger switch 26 from being triggered by a sudden increase in the ESD+ rail voltage under power-on conditions. It is important to recognize, however, that deactivation circuit 50 will not prevent ESD trigger switch 26 from being triggered by a real ESD event, which usually occurs under power-off conditions. The behavior of deactivation circuit 50 will now be described.

Referring to FIG. 2, a resistor 52 has been added to the circuit shown in FIG. 1. Resistor 52 is connected between the gate of transistor 28 and node 33 (which lies between resistor 32 and capacitor 34). A p-channel transistor 54 has also been added. P-channel transistor 54 has its source and substrate connected to the ESD+ rail, and its drain connected to the gate of transistor 28. Transistor 54 and resistor 52 act as a voltage divider, which will be described below.

Similar in function to resistor 52, resistor 56 has also been added. Resistor 56 is connected between the gate of transistor 30 and node 37 (which lies between capacitor 36 and resistor 38). Similar in function to p-channel transistor 54, an n-channel transistor 58 has also been added. N-channel transistor 58 has its source connected to the ESD− rail and its drain connected to the gate of transistor 30. Thus transistor 58 and resistor 56 also act as a voltage divider, which will be described below. (This voltage divider is similar to the voltage divider formed by transistor 54 and resistor 52).

Referring to FIG. 2, a transistor 60 and a resistor 62 have also been added. These components are connected in series between the 3.3 volt $V_{CC}$ supply and the ESD− rail. Transistor 60 is an n-channel transistor configured as a diode (i.e.

with its gate tied to its drain). Under power-on conditions, when 3.3 volt $V_{CC}$ power is being applied, and the ESD− rail is at ground potential, transistor 60 and resistor 62 act as a voltage divider, establishing a bias voltage at their common node 61.

As shown in FIG. 2, a resistor 64 has also been added. This resistor is connected between node 61 and the gate of transistor 54. Similarly, a resistor 66 has also been added. This resistor is connected between node 61 and the gate of transistor 58. The bias voltage present at node 61 is therefore used to bias the gates of transistors 54 and 58.

The bias voltage at node 61 should be chosen such that transistors 54 and 58 will both be on under all possible power-on conditions. This includes all possible voltage values on the ESD+ rail (i.e. from 2.75 volts to 5.25 volts). It also includes all possible voltage values on the 3.3 volt $V_{CC}$ power supply (i.e. from 3 volts to 3.6 volts).

When transistors 54 and 58 are turned on, they represent very small source-drain resistances in comparison to resistors 52 and 56. As a result, most of the voltage difference (if any) between the ESD+ rail and node 33 is dropped across resistor 52. Similarly, most of the voltage difference (if any) between the ESD− rail and node 37 is dropped across resistor 56.

When the ESD+ rail transitions suddenly (from a minimum low voltage of 2.75 volts to a maximum high voltage of 5.25 volts), the voltage at node 33 will not immediately respond to this increase due to the RC time constant delay provided by resistor 32 and capacitor 34. Thus, a 2.5 volt difference arises between the ESD+ rail voltage and the voltage at node 33. Most of this 2.5 volt difference will dropped across resistor 52. As a result, the gate of transistor 28 is kept close to the ESD+ rail voltage. This ensures that the gate-to-source voltage of transistor 28 remains below threshold, keeping transistor 28 off.

Similarly, when the ESD+ rail transitions suddenly from 2.75 volts to 5.25 volts, the voltage at node 37 responds immediately. Thus, a 2.5 volt difference arises between the ESD− rail voltage and the voltage at node 37. Most of this 2.5 volt difference will be dropped across resistor 56. This ensures that the gate-to-source voltage of transistor 30 remains below threshold, keeping transistor 30 off.

As described above, deactivation circuit 50 keeps transistor 28 off during a sudden increase in the ESD+ rail voltage under power-on conditions. This is accomplished by effectively coupling the gate of transistor 28 to the ESD+ rail, causing the gate-to-source voltage of transistor 28 to remain below threshold. Similarly, deactivation circuit 50 also keeps transistor 30 off during a sudden increase in the ESD+ rail voltage under power-on conditions. This is accomplished by effectively coupling the gate of transistor 30 to the ESD− rail, causing the gate-to-source voltage of transistor 30 to remain below threshold.

As described above, deactivation circuit 50 prevents ESD trigger-switch 26 from accidentally turning on when the voltage on the ESD+ rail suddenly rises under power-on conditions. However, in order to provide ESD protection when power is turned off, deactivation circuit 50 must be disabled under power-off conditions. As shown in FIG. 2, this is partially accomplished by the addition of capacitor 68, which is connected between the ESD+ rail and the gate of transistor 54.

Immediately prior to a power-off ESD event, capacitor 68 will be uncharged. Furthermore, capacitor 68 and resistor 64 have an RC time constant of approximately 25 to 50 microseconds. Thus, during a power-off ESD event, capacitor 68 keeps the gate-to-source voltage of transistor 54 below threshold, ensuring that this transistor remains off for approximately 25 to 50 microseconds. This ensures that transistor 54 will remain turned off during a power-off ESD event, whose duration is considerably shorter than 25 to 50 microseconds. While transistor 54 is turned off, transistor 28 will be able to turn on during an ESD event, as described in previous paragraphs.

Referring to FIG. 2, capacitor 68 and resistor 64 also ensure that transistor 54 will remain off when the 3.3 volt $V_{CC}$ pin is zapped under power-off conditions. This allows the $V_{CC}$ pin to receive ESD protection which is identical to that provided to all other I/O pins.

In order to completely disable deactivation circuit 50 under power-off conditions, capacitor 70 must also be added. As shown in FIG. 2, capacitor 70 is connected between the ESD− rail and the gate of transistor 58. Immediately prior to a power-off ESD event, capacitor 70 will be uncharged. Furthermore, capacitor 70 and resistor 66 have an RC time constant of approximately 25 to 50 microseconds, the same as capacitor 68 and resistor 64. Thus, during a power-off ESD event, capacitor 70 keeps the gate-to-source voltage of transistor 58 below threshold, ensuring that this transistor remains off for approximately 25 to 50 microseconds. This ensures that transistor 58 will remain turned off during a power-off ESD event, whose duration is considerably shorter than 25 to 50 microseconds. While transistor 58 is turned off, transistor 30 will be able to turn on during an ESD event, as described in previous paragraphs.

Although the present invention and its advantages have been described in detail, it should be understood that various changes, substitutions, and alterations can be made to it without departing from the spirit and scope of the invention as defined by the appended claims.

What is claimed is:

1. An electrostatic discharge protection circuit for a plurality of signal nodes, the electrostatic discharge protection circuit comprising:

a positive electrostatic discharge node;

a negative electrostatic discharge node;

a first electrostatic discharge diode coupled between a first one of the signal nodes and the positive electrostatic discharge node;

a second electrostatic discharge diode coupled between the first signal node and the negative electrostatic discharge node;

a third electrostatic discharge diode coupled between a second one of the signal nodes and the positive electrostatic discharge node;

a fourth electrostatic discharge diode coupled between the second signal node and the negative electrostatic discharge node; and a trigger switch connected to the positive and negative electrostatic discharge nodes, the trigger switch having:

a first transistor having a first source/drain terminal coupled to the positive electrostatic discharge node;

a second transistor having a first source/drain terminal coupled to the negative electrostatic discharge node, the second transistor having a second source/drain terminal coupled to a second source/drain terminal of the first transistor;

a first resistance coupled between the positive electrostatic discharge node and a gate terminal of the first transistor;

a first capacitance coupled between the negative electrostatic discharge node and the gate terminal of the first transistor;

a second resistance coupled between the negative electrostatic discharge node and a gate terminal of the second transistor; and a second capacitance coupled between the positive electrostatic discharge node and the gate terminal of the second transistor wherein the trigger switch is operable to provide a low-resistance connection between the positive and negative electrostatic discharge nodes of the electrostatic discharge protection circuit in response to an electrostatic discharge event.

2. The electrostatic discharge protection circuit of claim 1, wherein the trigger switch further comprises a bias circuit operable to provide a bias voltage to the respective second source/drain terminals of the first and second transistors.

3. The electrostatic discharge protection circuit of claim 1, wherein the first capacitance comprises a third transistor having source and drain terminals connected together.

4. The electrostatic discharge protection circuit of claim 3, wherein the first capacitance further comprises a fourth transistor having a gate terminal coupled to the source and drain terminals of the third transistor, the fourth transistor further having source and drain terminals connected together.

5. The electrostatic discharge protection circuit of claim 4, further comprising a bias circuit operable to provide a bias voltage to the source and drain terminals of the third transistor and to the gate terminal of the fourth transistor.

6. The electrostatic discharge protection circuit of claim 5, wherein the bias circuit comprises a diode connected between a reference voltage node and the gate terminal of the fourth transistor.

7. The electrostatic discharge protection circuit of claim 1, wherein the first and second transistors comprise MOSFETs.

8. The electrostatic discharge protection circuit of claim 1, wherein the first transistor comprises a p-channel transistor, and wherein the second transistor comprises an n-channel transistor.

9. The electrostatic discharge protection circuit of claim 1, further comprising a deactivation circuit having:

a variable resistance coupled between the positive electrostatic discharge node and the gate terminal of the first transistor;

a third resistance coupled between the first resistance and the gate terminal of the first transistor;

a control circuit connected to the variable resistance and operable to set the variable resistance to a value less than the third resistance under power-on conditions.

10. The electrostatic discharge protection circuit of claim 9, wherein the variable resistance of the deactivation circuit comprises a field-effect transistor having a gate terminal coupled to the control circuit.

11. The electrostatic discharge protection circuit of claim 10, wherein the control circuit comprises a bias voltage generator coupled between a reference voltage node and the negative electrostatic discharge node, the bias voltage generator being operable to supply a bias voltage to the gate terminal of the field-effect transistor.

12. The electrostatic discharge protection circuit of claim 11, wherein the deactivation circuit further comprises a third capacitance coupled between the positive electrostatic discharge node and the gate terminal of the field-effect transistor.

13. An integrated circuit chip comprising:
   an internal power supply node providing a power supply voltage at a first voltage level;
   an input pad operable to connect to an external signal carrier, and to receive an input signal at a second voltage level from the external signal carrier, the second voltage level being greater than the first voltage level;
   an input buffer coupled to receive the input signal from the input pad; and
   an electrostatic discharge protection circuit coupled to the input pad, the electrostatic discharge protection circuit having:
      a positive electrostatic discharge node;
      a negative electrostatic discharge node;
      a first electrostatic discharge diode coupled between the input pad and the positive electrostatic discharge node;
      a second electrostatic discharge diode coupled between the input pad and the negative electrostatic discharge node; and
      a trigger switch connected to the positive and negative electrostatic discharge nodes and operable to provide a low-resistance connection between the positive and negative electrostatic discharge nodes in response to an electrostatic discharge event, the trigger switch including:
         a first transistor having a first source/drain terminal coupled to the positive electrostatic discharge node;
         a second transistor having a first source/drain terminal coupled to the negative electrostatic discharge node, the second transistor having a second source/drain terminal coupled to a second source/drain terminal of the first transistor;
         a first resistance coupled between the positive electrostatic discharge node and a gate terminal of the first transistor;
         a first capacitance coupled between the negative electrostatic discharge node and the gate terminal of the first transistor;
         a second resistance coupled between the negative electrostatic discharge node and a gate terminal of the second transistor; and
         a second capacitance coupled between the positive electrostatic discharge node and the gate terminal of the second transistor.

14. The integrated circuit chip of claim 13, wherein the first and second transistors comprise MOSFETs.

15. The integrated circuit chip of claim 13, wherein the first transistor comprises a p-channel transistor, and wherein the second transistor comprises an n-channel transistor.

16. The integrated circuit chip of claim 13, further comprising a deactivation circuit having:
   a variable resistance coupled between the positive electrostatic discharge node and the gate terminal of the first transistor;
   a third resistance coupled between the first resistance and the gate terminal of the first transistor;
   a control circuit connected to the variable resistance and operable to set the variable resistance to a value less than the third resistance under power-on conditions.

17. The integrated circuit chip of claim 16, wherein the variable resistance of the deactivation circuit comprises a field-effect transistor having a gate terminal coupled to the control circuit.

18. The integrated circuit chip of claim 17, wherein the control circuit comprises a bias voltage generator coupled between a reference voltage node and the negative electrostatic discharge node, the bias voltage generator being operable to supply a bias voltage to the gate terminal of the field-effect transistor.

19. The electrostatic discharge protection circuit of claim 18, wherein the deactivation circuit further comprises a third capacitance coupled between the positive electrostatic discharge node and the gate terminal of the field-effect transistor.

20. A trigger switch for an electrostatic discharge protection circuit, the trigger switch comprising:
   a first transistor having a first source/drain terminal coupled to a positive electrostatic discharge node of the electrostatic discharge protection circuit;
   a second transistor having a first source/drain terminal coupled to a negative electrostatic discharge node of the electrostatic discharge protection circuit, the second transistor having a second source/drain terminal coupled to a second source/drain terminal of the first transistor;
   a first resistance coupled between the positive electrostatic discharge node and a gate terminal of the first transistor;
   a first capacitance coupled between the negative electrostatic discharge node and the gate terminal of the first transistor;
   a second resistance coupled between the negative electrostatic discharge node and a gate terminal of the second transistor; and
   a second capacitance coupled between the positive electrostatic discharge node and the gate terminal of the second transistor;
   wherein the trigger switch is operable to provide a low-resistance connection between the positive and negative electrostatic discharge nodes of the electrostatic discharge protection circuit in response to an electrostatic discharge event.

* * * * *